United States Patent
Yu et al.

(10) Patent No.: US 6,815,820 B2
(45) Date of Patent: Nov. 9, 2004

(54) METHOD FOR FORMING A SEMICONDUCTOR INTERCONNECT WITH MULTIPLE THICKNESS

(75) Inventors: Kathleen C. Yu, Austin, TX (US); Kirk J. Strozewski, Round Rock, TX (US); Janos Farkas, Austin, TX (US); Hector Sanchez, Cedar Park, TX (US); Yeong-Jyh T. Lii, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 16 days.

(21) Appl. No.: 10/141,714

(22) Filed: May 9, 2002

(65) Prior Publication Data

US 2003/0209779 A1 Nov. 13, 2003

(51) Int. Cl.[7] .............................................. H01L 23/48
(52) U.S. Cl. ...................... 257/758; 257/773; 257/774; 257/776; 438/128; 438/597; 438/618; 438/620; 438/635
(58) Field of Search ................................. 257/758, 773, 257/774, 776; 438/128, 597, 618, 620, 622, 624, 629, 637, 666, 738

(56) References Cited

U.S. PATENT DOCUMENTS

| | | | |
|---|---|---|---|
| 5,258,328 A | | 11/1993 | Sunada et al. |
| 5,539,255 A | | 7/1996 | Cronin |
| 5,663,101 A | | 9/1997 | Cronin |
| 5,960,254 A | * | 9/1999 | Cronin .......................... 438/14 |
| 6,097,092 A | * | 8/2000 | Natzle .......................... 257/758 |
| 6,100,177 A | * | 8/2000 | Noguchi ...................... 438/620 |
| 6,225,207 B1 | | 5/2001 | Parikh |
| 6,331,734 B1 | * | 12/2001 | Hieda .......................... 257/775 |
| 6,361,402 B1 | | 3/2002 | Canaperi et al. |
| 6,392,299 B1 | | 5/2002 | Gayet |
| 6,577,011 B1 | * | 6/2003 | Buchwalter et al. ......... 257/758 |
| 6,638,871 B2 | * | 10/2003 | Wang et al. ................ 438/694 |
| 2002/0022370 A1 | | 2/2002 | Sun et al. |

* cited by examiner

Primary Examiner—Minhloan Tran
Assistant Examiner—Remmon R. Fordé
(74) Attorney, Agent, or Firm—Robert L. King; James L. Clingan, Jr

(57) ABSTRACT

A conductive line varies in thickness to assist in overcoming RC delays and noise coupling. By varying line thickness, variation in conductor width is avoided if necessary to maintain a specified minimum pitch between conductors while maintaining predetermined desired RC parameters and noise characteristics of the conductive line. Conductor depth variation is achieved by etching a dielectric layer to different thicknesses. A subsequent conductive fill over the dielectric layer and in the differing thicknesses results in a conductive line that varies in thickness. Different conductive line thicknesses available at a particular metal level can additionally be used for semiconductor structures other than a signal or a power supply conductive line, such as a contact, a via or an electrode of a device. The thickness analysis required to determine how interconnect thickness is varied in order to meet a desired design criteria may be automated and provided as a CAD tool.

16 Claims, 9 Drawing Sheets

METHOD FOR FORMING A SEMICONDUCTOR INTERCONNECT WITH MULTIPLE THICKNESS

FIELD OF THE INVENTION

This invention relates generally to semiconductors, and more specifically, to the manufacture of interconnect structures within semiconductor devices.

BACKGROUND OF THE INVENTION

Semiconductors are designed pursuant to specific design rules that must be met in order to successfully manufacture an integrated circuit with a targeted process. Such design rules involve a variety of performance tradeoffs including speed versus power, resistance versus capacitance, electromigration versus area, and others. These tradeoffs are the result of process limitations. For example, for a given conductor only one thickness of a specified metal layer may be used.

Various compensation methods are used to balance these tradeoffs. Standard techniques involve thin metals being used first in the construction of the circuit in order to minimize the impact of capacitance. The larger the cross sectional area a conductor has, the more capacitive coupling to neighboring metals the conductor has. Additionally, the use of dielectric materials adjacent a conductor creates an inherent capacitor. Advanced interconnect processes are characterized by having thin dielectric layers. Thin dielectrics result in conductors that have less capacitance but more resistance. Others have used various dielectric materials, such as low K (low dielectric constant) materials, to reduce capacitive coupling between conductors. Disadvantages of low K dielectrics include mechanical stability, defectivity, compatibility with metalization techniques and expense.

Metals having larger widths or vertically thicker dimensions are therefore used to minimize the impact of resistance. However, having a larger cross sectional area for a conductor results in a lower resistance, but also produces a larger circuit and typically higher capacitance.

A result of these characteristics is to use a hierarchical scheme within a multiple layer semiconductor where each layer is designed specifically to have differing conductor dimensions tailored to a specific capacitance/resistance tradeoff. Complex routing schemes are often required to connect these various layers in order to obtain an optimal balance of capacitance and resistance. These complex routing schemes result in larger integrated circuits and more expensive processes as a result of more processing steps being required. Present designs using existing known processes are limited in performance and size by balancing the tradeoffs inherent in capacitive/resistive tradeoffs.

A known compensation method is to use multiple layers of metal for a design. For example, multiple layers in the amount of nine to twelve are implemented and future processes will have the capability for many more. The multiple layers provide a designer with various resistance/capacitance properties so that a designer may select a particular metal layer for a predetermined function based upon the desired electrical characteristic. Several disadvantages that are inherent in the use of more metal layers include additional processing costs associated with such layers and additional size. Via layers are required to connect two or more conductors and such via layers tend to be defect prone for various reasons. Therefore, it is desired to minimize the need for and use of via layers.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
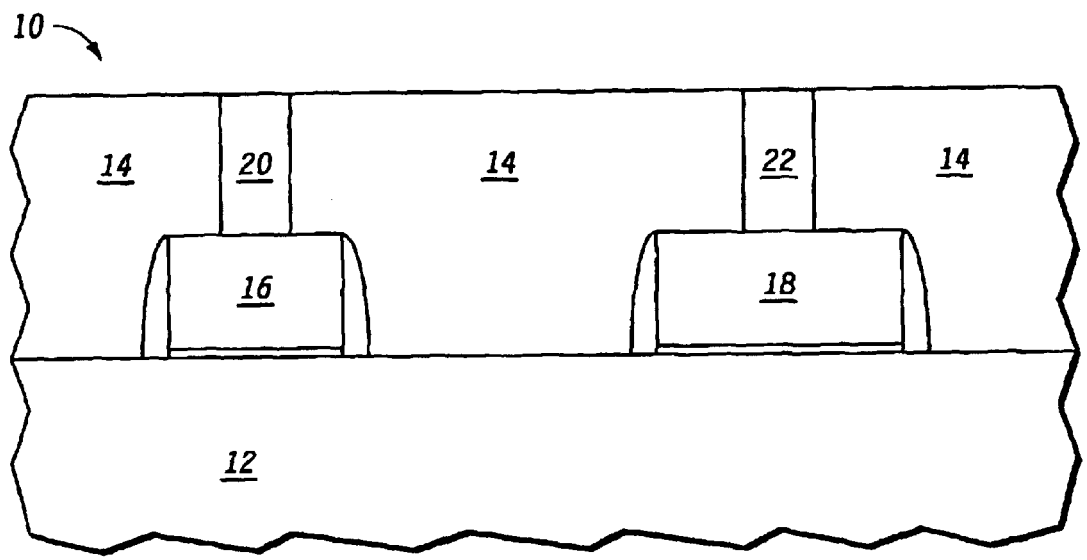
FIGS. 1–8 illustrate in cross-sectional form a first form of a semiconductor having interconnect layers of multiple thickness.

Illustrated in FIG. 1 is a cross section of a semiconductor device structure 10 having a semiconductor substrate 12. It should be well understood herein that the drawings are illustrated for purposes of explanation and are not necessarily drawn to scale. Formed on a top surface of semiconductor substrate 12 are transistor control electrodes (i.e. gates for a CMOS process) 16 and 18. Electrical contact to the control electrodes 16 and 18 will be created. Control electrodes 16 and 18 have sidewall spacers (not numbered) and other elements (not shown) associated with a transistor device. While an interconnect to a transistor gate is illustrated herein, it should be well understood that the interconnect structures taught herein may be utilized to make electrical contact with any semiconductor structure. Overlying semiconductor substrate 12 and surrounding control electrodes 16 and 18 is a patterned dielectric 14. Within the pattern there is formed a conductor 20 overlying gate electrode 16 and a conductor 22 overlying gate electrode 18. Conductor 20 provides electrical contact to gate electrode 16 and conductor 22 provides electrical contact to gate electrode 18.

Figure 2:
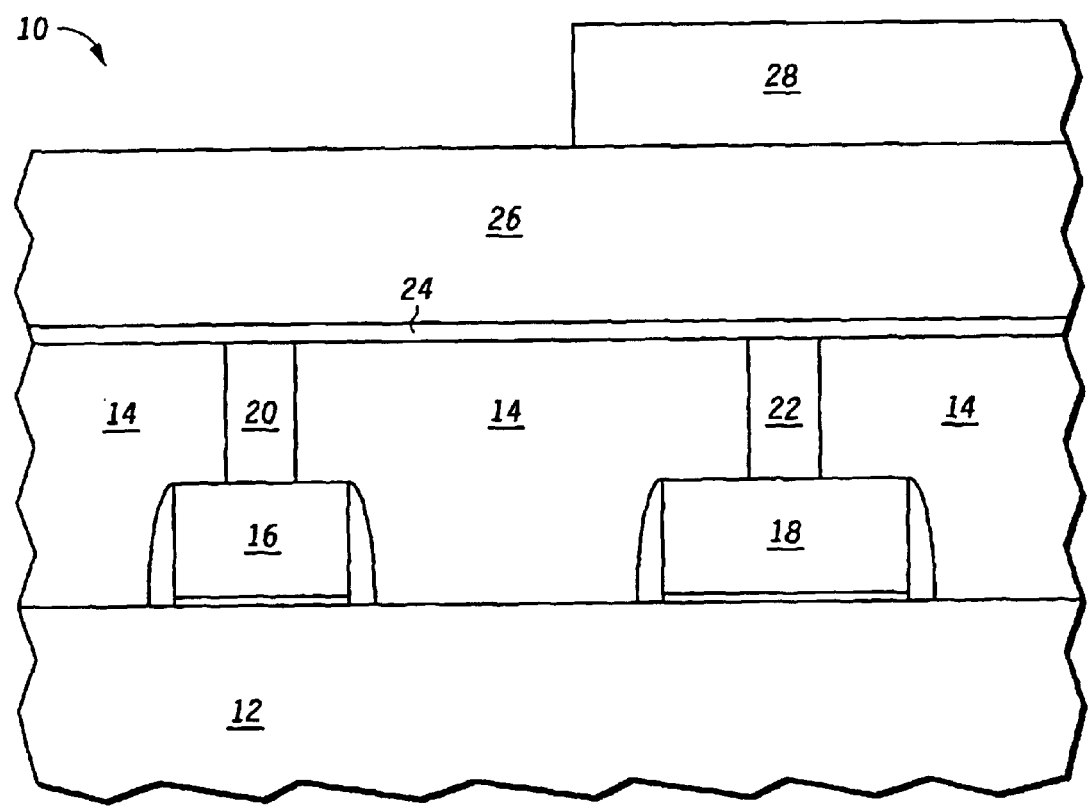

Illustrated in FIG. 2 is a cross section of semiconductor device structure 10 having an etch stop layer 24 overlying patterned dielectric 14 and conductors 20 and 22. Etch stop layer 24 is also a dielectric layer. Overlying etch stop layer 24 is a dielectric layer 26. Various dielectrics may be used for dielectric layer 26 including, but not limited to, silicon dioxide, TEOS, fluorinated silicon dioxide and numerous commercially available low K materials. Dielectric layer 26 has a top portion having a different etch characteristic than a lower portion immediately below the top portion. Depending upon the dielectric chosen for dielectric layer 26, the etch stop layer 24 may be any material having a much lower etch rate. A patterned photoresist 28 overlies a portion of dielectric layer 26 pursuant to conventional pattern techniques. In one form, the patterned photoresist 28 is a polymeric material.

Figure 3:
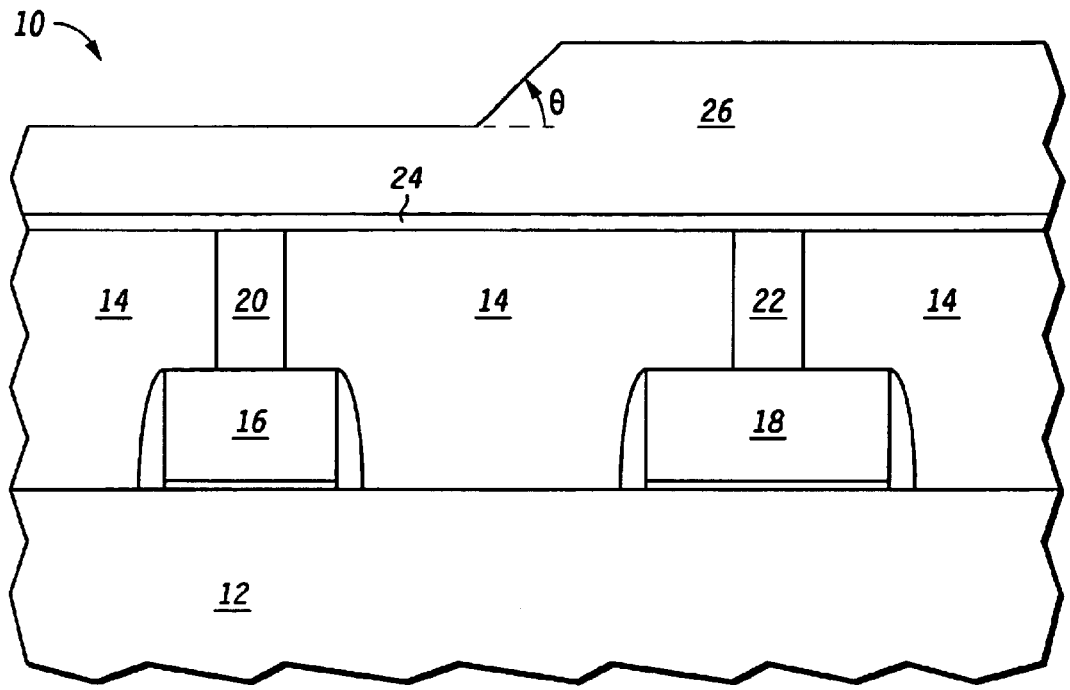

Illustrated in FIG. 3 is a cross section of semiconductor device structure 10 after an etch has occurred. The dielectric layer 26 is thinned in part. An exposed first or top portion of dielectric layer 26 is etched over an intended location of an opening with a first etchant. In one form, an exposed second or lower portion of dielectric layer 24 is etched with a second etchant that is different from the first etchant. The etch process removes a portion of dielectric layer 26 where the patterned photoresist 28 is absent. The edge of photoresist 28 produces a sloped surface or sloped edge on a portion of an upper surface of dielectric layer 26. The slope is illustrated by an angle, θ, and is not greater than about fifty degrees. The resulting upper surface of dielectric layer 26 remains planar above both the thinner portion and the thicker portion. The resulting dielectric layer 26 has a first area overlying an intended location of the opening and a second area where the first area is thinner than the second area.

Figure 4:
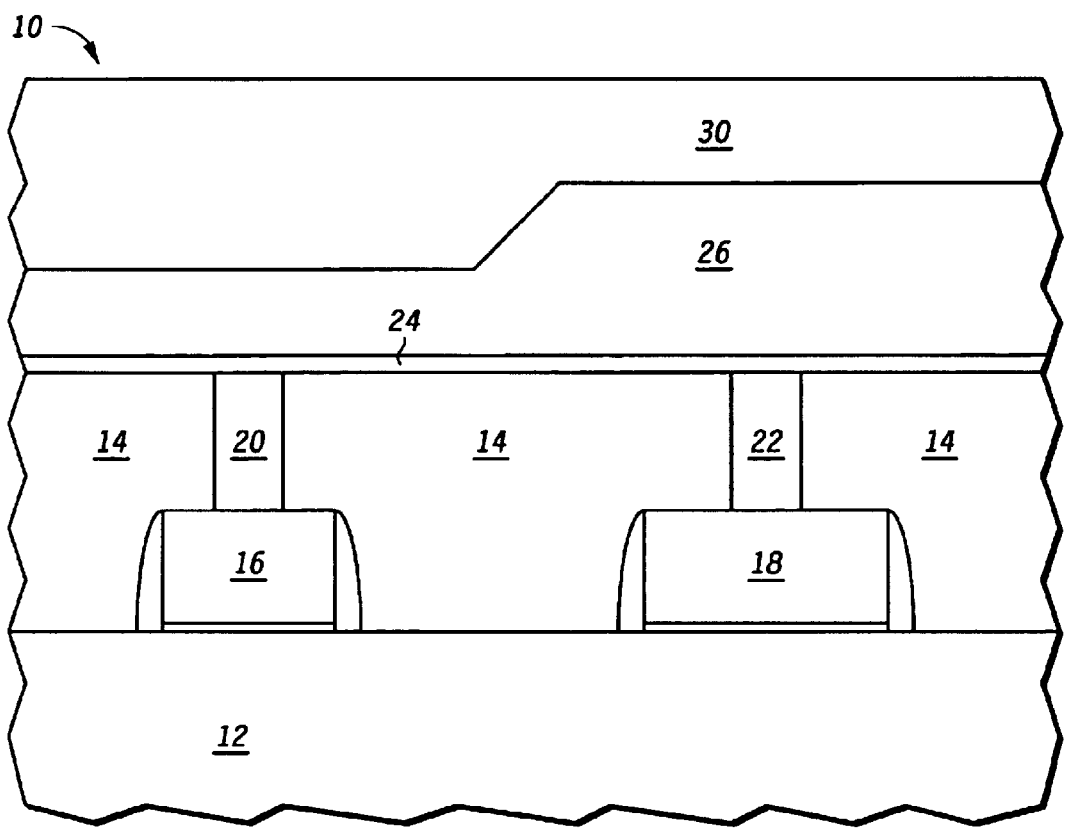

Illustrated in FIG. 4 is a cross section of semiconductor device structure 10 having an overlying polymeric material 30 that planarizes the topography produced in FIG. 3. The purpose of polymeric material 30 is to provide a planar upper surface for further processing. Polymeric material 30 functions as a planarized layer and is a removable layer. In one form, polymeric material 30 may be implemented with a Novolak-based material. Polymeric material 30 is a relatively thick self-planarizing material. It should be noted that other materials besides polymeric materials may be used to perform the self-planarizing layer.

Figure 5:
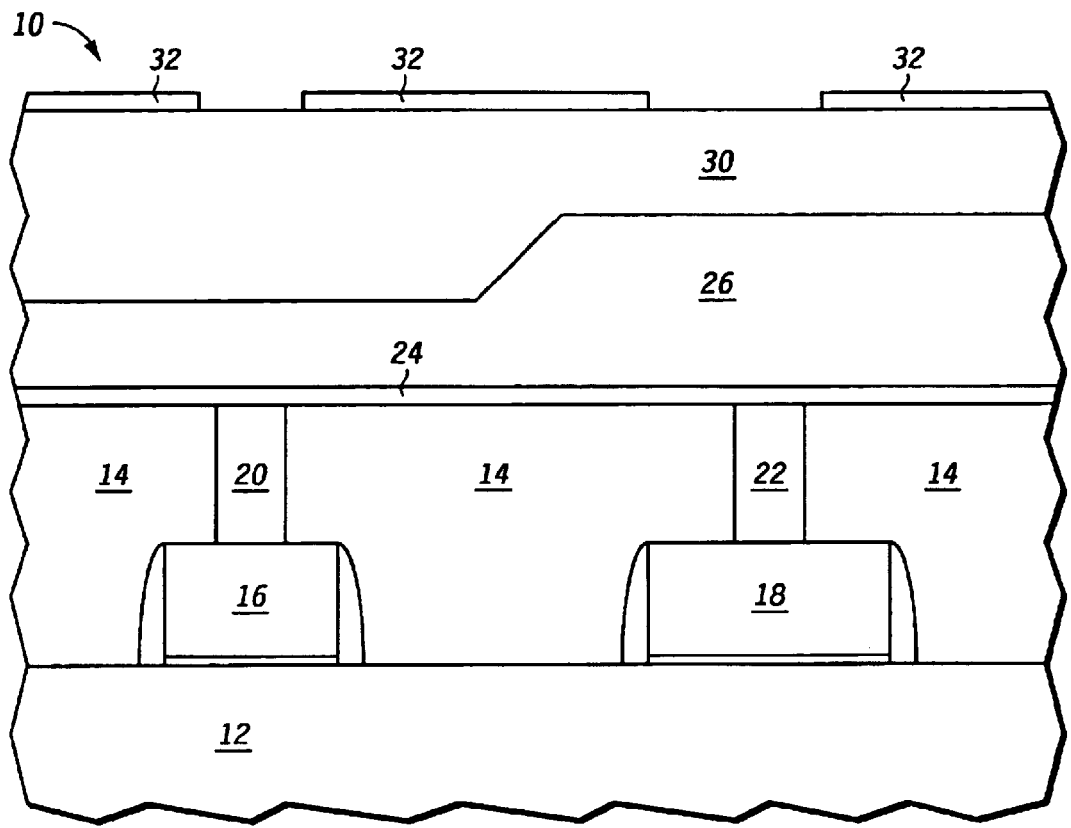

Illustrated in FIG. 5 is a cross section of semiconductor device structure 10 having patterned material 32 that is patterned using standard photo techniques. In one form, polymeric material 30 has an initial thickness that is etched in part to a reduced thickness prior to forming patterned material 32. In one form, material 32 may be implemented as a silicon-containing photoresist. The photoresist is patterned according to a pattern and the pattern is transferred to polymeric material 30. The openings in patterned material 32 are formed overlying conductor 20 and conductor 22.

Figure 6:
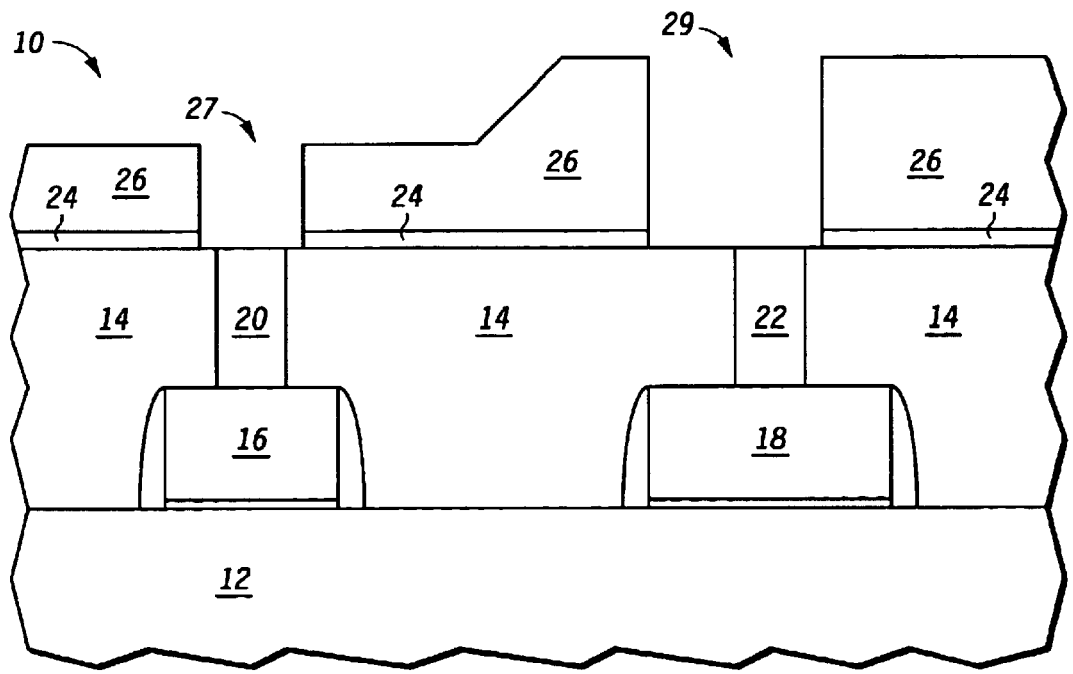

Illustrated in FIG. 6 is a cross section of semiconductor device structure 10 resulting from etching that removes polymeric material 30 and a portion of dielectric layer 26. Therefore, polymeric material 30 functions as a patterned removable layer. The patterned material 32 determines the location of openings in dielectric layer 26 such as opening 27 of a first height and opening 29 of a second height that is greater than the first height. The opening 27 has a top surface and a bottom surface. The opening 29 has a top surface and a bottom surface. The bottom surface of opening 27 is coplanar with the bottom surface of opening 29. Because patterned material 32 is silicon-containing, the etch selectivity between polymeric material 30 and patterned material 32 is very high. Further etching is performed to pattern dielectric layer 26 and initially stops at an upper surface of etch stop layer 24. A third portion of the etch removes etch stop layer 24 to expose conductors 20 and 22. Polymeric material 30 and patterned material 32 are then removed by conventional strip techniques (either wet etch or dry etch techniques). It should be appreciated that if dielectric layer 14 and pattern dielectric layer 26 are formed of different material that etch stop layer 24 may not be necessary.

Figure 7:
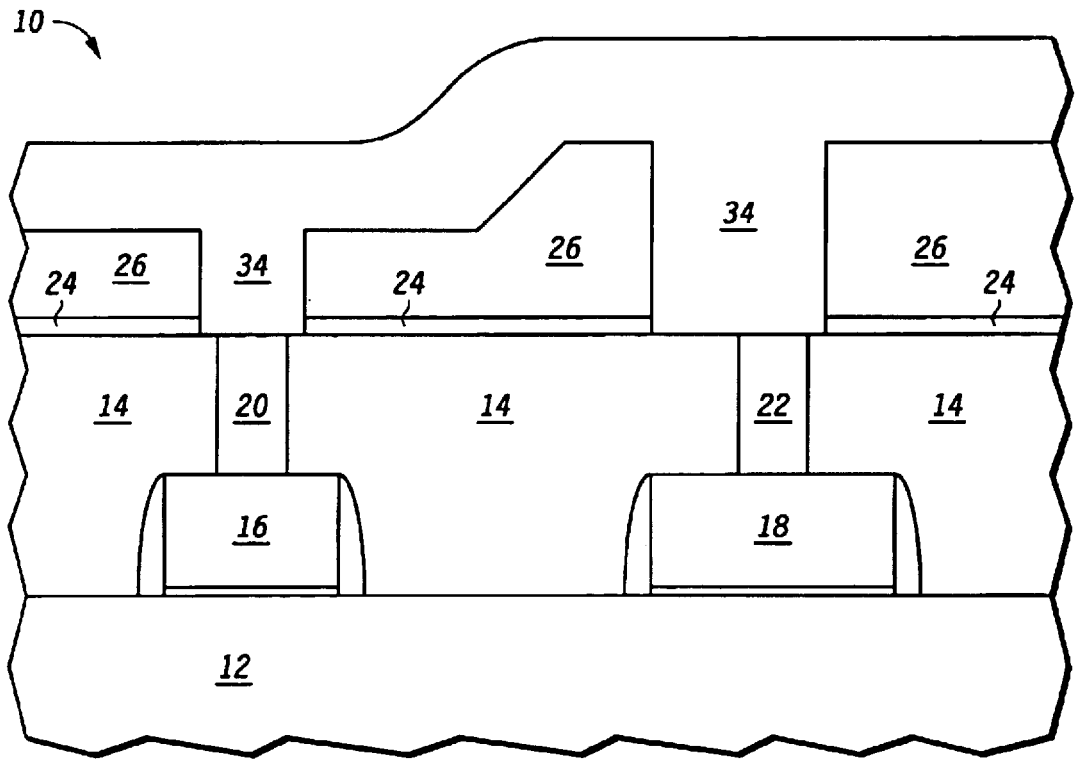

Illustrated in FIG. 7 is a cross section of semiconductor device structure 10 having a conductive layer 34 deposited onto all exposed surfaces and fills opening 27 and opening 29. The portion of conductive layer 34 within opening 27 forms a first current carrying line, and the portion of conductive layer 34 within opening 29 forms a second current carrying line. The first current carrying line and the second current carrying line adjoin at an angle of not greater than about fifty degrees and are for carrying current parallel to the top surface of the semiconductor substrate 12. While conductive layer 34 may be implemented with any conducting material, in one form, copper is used as conductive layer 34. It should be noted that the deposition of conductive layer 34 is conformal and that the upper surface of semiconductor device structure 10 is nonplanar at this point. It should be appreciated however that conductive layer 34 may be deposited in a manner so that conductive layer 34 is planar.

Figure 8:
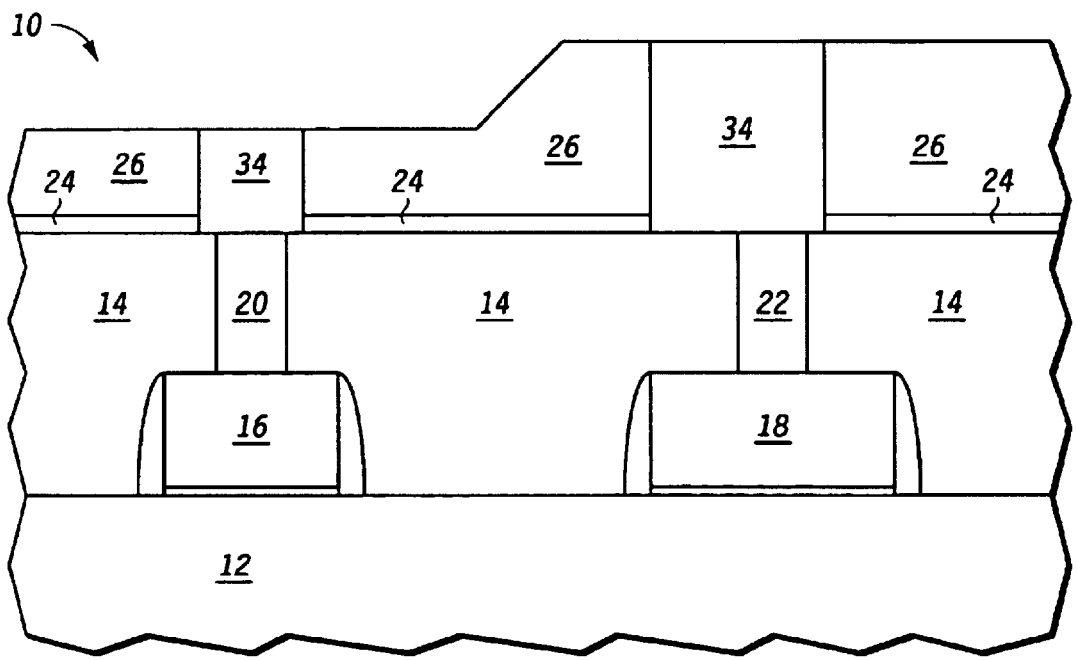

Illustrated in FIG. 8 is a cross section of semiconductor device structure 10 where conductive layer 34 is removed from all areas of the semiconductor device structure 10 except the previously patterned areas of dielectric layer 26. In particular, but not by limitation, removal of conductive layer 34 above the plane containing the upper surface of dielectric layer 26 is accomplished by electro chemical polishing, chemical mechanical polishing (CMP) or etching. A relatively linear sloped surface is present at the upper surface of dielectric layer 26 between the portions of conductive layer 34 overlying conductors 20 and 22. The slope functions to facilitate reliable removal of undesired portions of conductive layer 34. The presence of the slope, as opposed to a straight ninety-degree side wall, avoids the existence of remainder portions of conductive layer 34 existing between those portions of conductive layer 34 overlying conductors 20 and 22. Such remainder material, if present, could possibly undesirably electrically connect with other conductive areas of semiconductor device structure 10.

Figure 9:
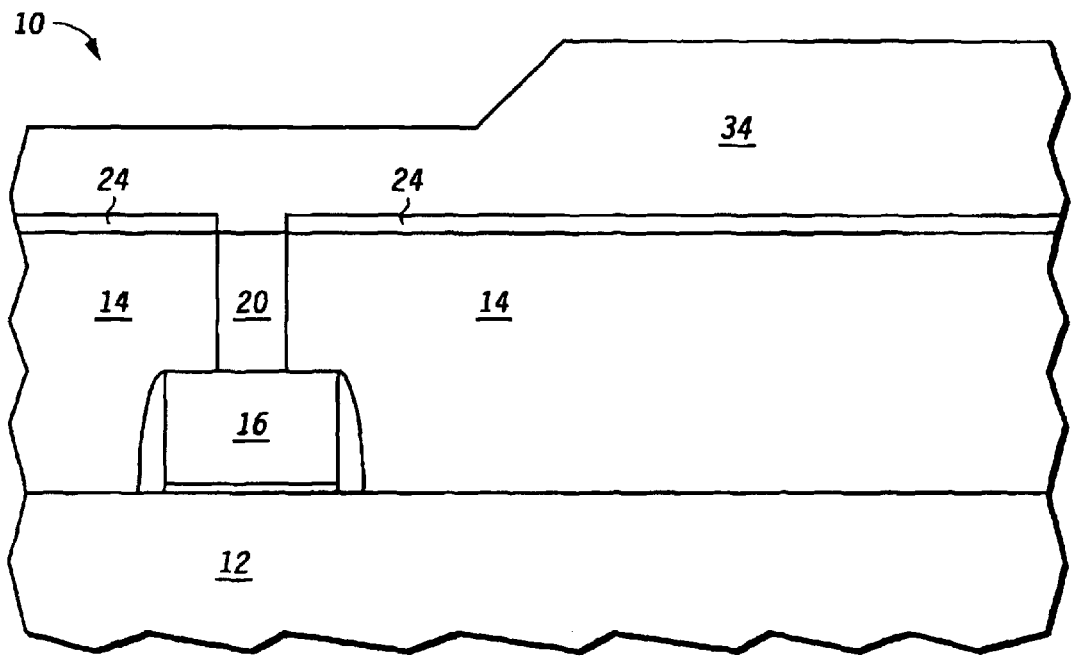
FIG. 9 illustrates in cross-sectional form perpendicular to the view of FIGS. 1–8 another interconnect pattern formed with the method of FIGS. 1–8 and having areas of differing thickness.

Illustrated in FIG. 9 is a cross section of an alternative interconnect structure for conductive layer overlying conductor 20 in semiconductor device structure 10. The illustrated cross-section of FIG. 9 is a cross section in a plane that is orthogonal to the plane of the cross-section of FIGS. 1–8. For convenience of illustration, the same numbers are used for identical elements. In particular, the conductive layer 34 is laterally extended to include a multiple height conductive layer. Conductive layer 34 therefore fills a continuous opening in dielectric layer 26 (not shown) that was previously formed. The continuous opening that conductive layer 34 fills has a first portion overlying conductor 20 and has a first height. The continuous opening also has a second portion that is laterally adjacent the first portion and has a second height greater than the first height. The slope within conductive layer 34 is a consequence of the slope in dielectric layer 26. As a result, an interconnect structure results wherein a single interconnect in the same layer (i.e. intralayer) transitions between a "thin" region and a "thicker" region. It should be noted that the surface of conductive layer 34 adjoining etch stop layer 24 is planar. Further, the interconnect formed by conductive layer 34 and conductor 20 is planar only on one side rather than on two sides. In the illustrated form, conductor 20 carries current in a vertical direction or orthogonal to the substrate 12, and conductive layer 34 carries current in a horizontal direction or in parallel to the substrate 12.

Figure 10:
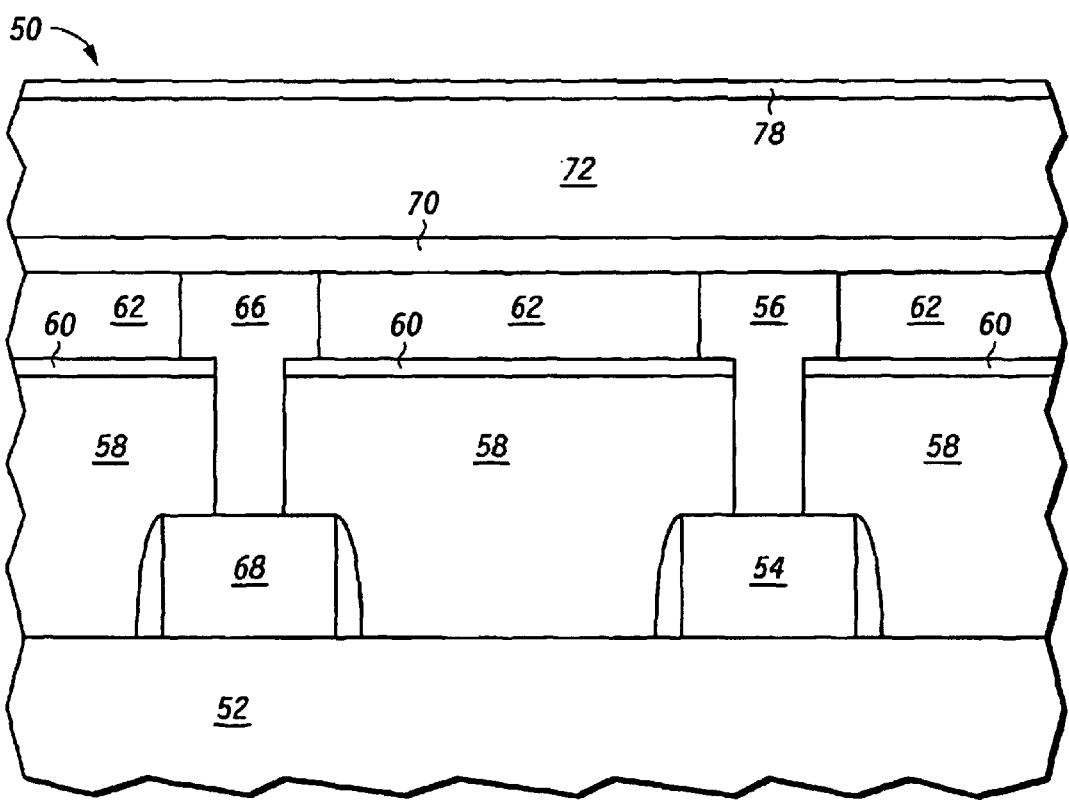
FIGS. 10–15 illustrate in cross-sectional form a second form of a semiconductor having interconnects of multiple thickness.

Illustrated in FIG. 10 is a cross-section of a semiconductor device 50 illustrating another form of the interconnect structure taught herein. A substrate 52 has formed thereon a control electrode 54 and a control electrode 68. Control electrodes 54 and 68 are portions of a transistor structure (not illustrated) that includes sidewall spacers (not numbered). A first dielectric layer 58 surrounds and overlies a portion of the transistor structure including control electrodes 54 and 68. An overlying etch stop layer 60 is patterned and a second dielectric layer 62 is formed overlying the etch stop layer 60 and similarly patterned. A conductor 56 is deposited overlying control electrode 54, and a conductor 66 is deposited overlying control electrode 68. In one form, conductor 56 and conductor 66 are formed using a same conductive material, but it should be understood that differing conductive materials may be used. An optional etch stop layer 70 is formed overlying the second dielectric layer 62, conductor 56 and conductor 66. If etch stop layer 70 is not implemented as described herein it should be appreciated that some alternate etch techniques are required that do not rely on etch stop layer 70. A third dielectric layer 72 is formed overlying the etch stop layer 70. Overlying the third dielectric layer 72 is a masking layer or a mask etch stop layer 78. Therefore, an initial portion of an electrical interconnect to each of control electrodes 54 and 68 is provided by conductors 66 and 56.

Figure 11:
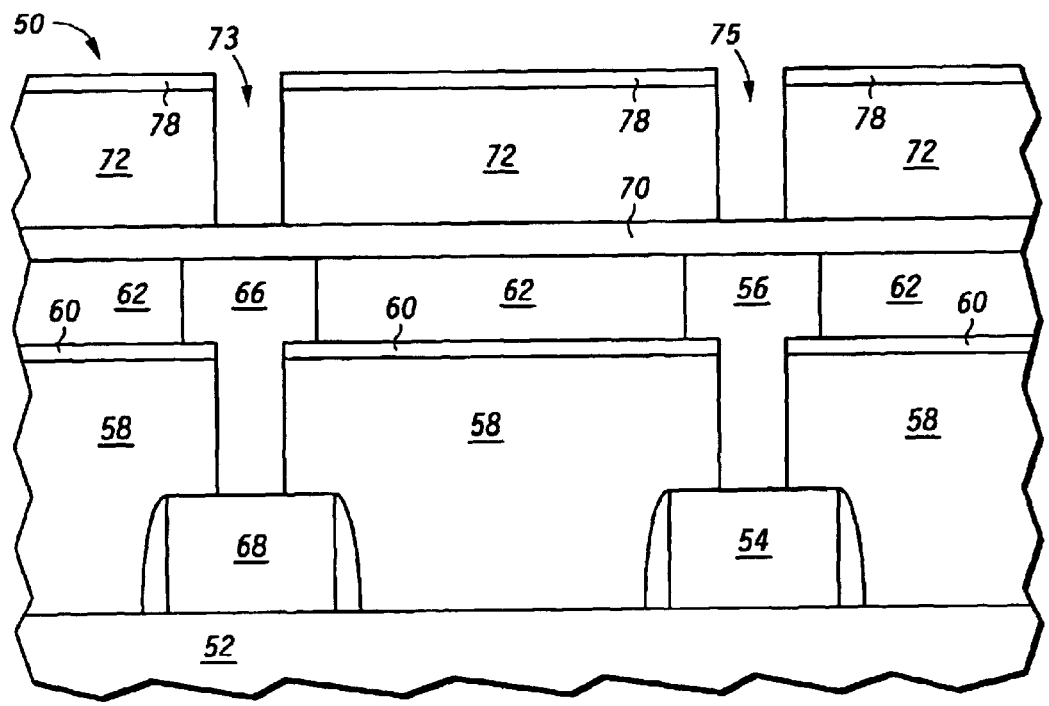

Illustrated in FIG. 11 is a cross-section of semiconductor device 50 wherein selective etching of etch stop layer 78 and the third dielectric layer 72 creates an opening 73 and an opening 75. Opening 73 has a top surface and a bottom surface, and opening 75 has a top surface and a bottom surface. The top surface of opening 73 is coplanar with the top surface of opening 75. The etching is stopped by etch stop layer 70. It should be noted that etch stop layer 70 is optional depending upon the selection of materials for the third dielectric layer 72 and the second dielectric layer 62. If the third dielectric layer 72 and the second dielectric layer 62 are implemented with differing materials, then etch stop layer 72 may not be needed.

Figure 12:
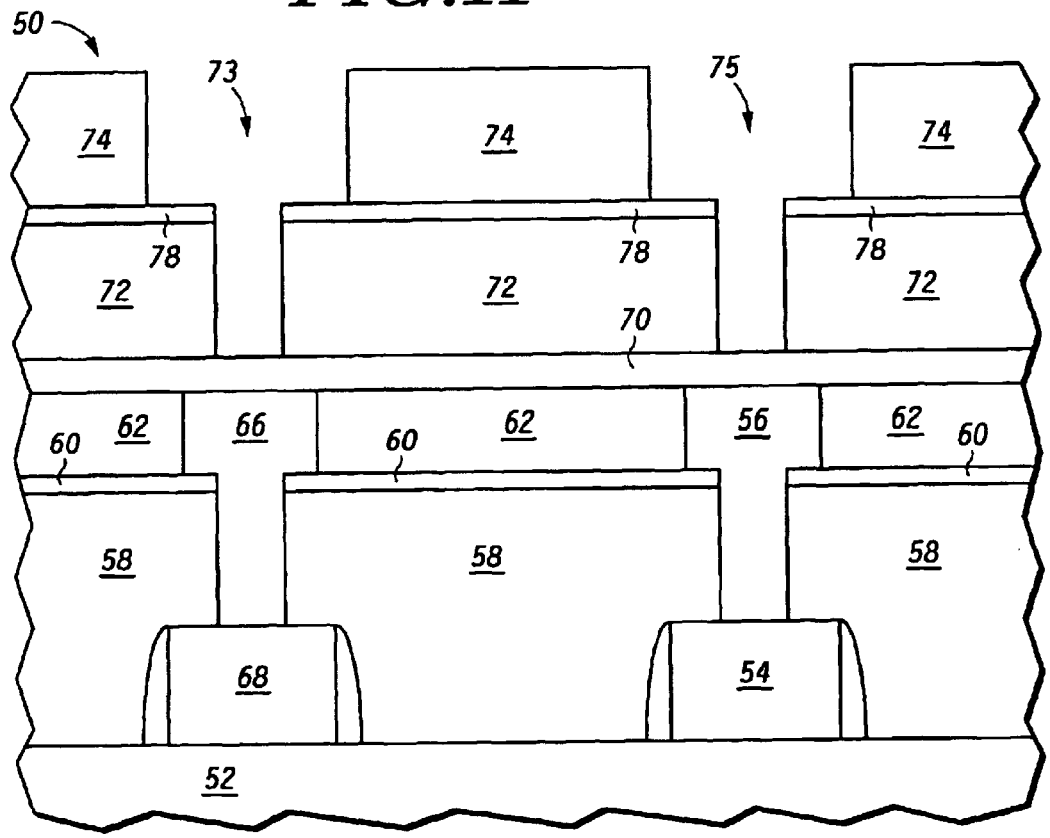

Illustrated in FIG. 12 is a cross-section of semiconductor device 50 wherein a patterned photoresist layer 74 is formed overlying portions of etch stop layer 78 according to a predetermined pattern. A first metal pattern is formed by the patterned photoresist layer 74 in accordance with a first mask. The shape and size of opening 73 and opening 75 is modified by the presence of patterned photoresist layer 74.

Figure 13:
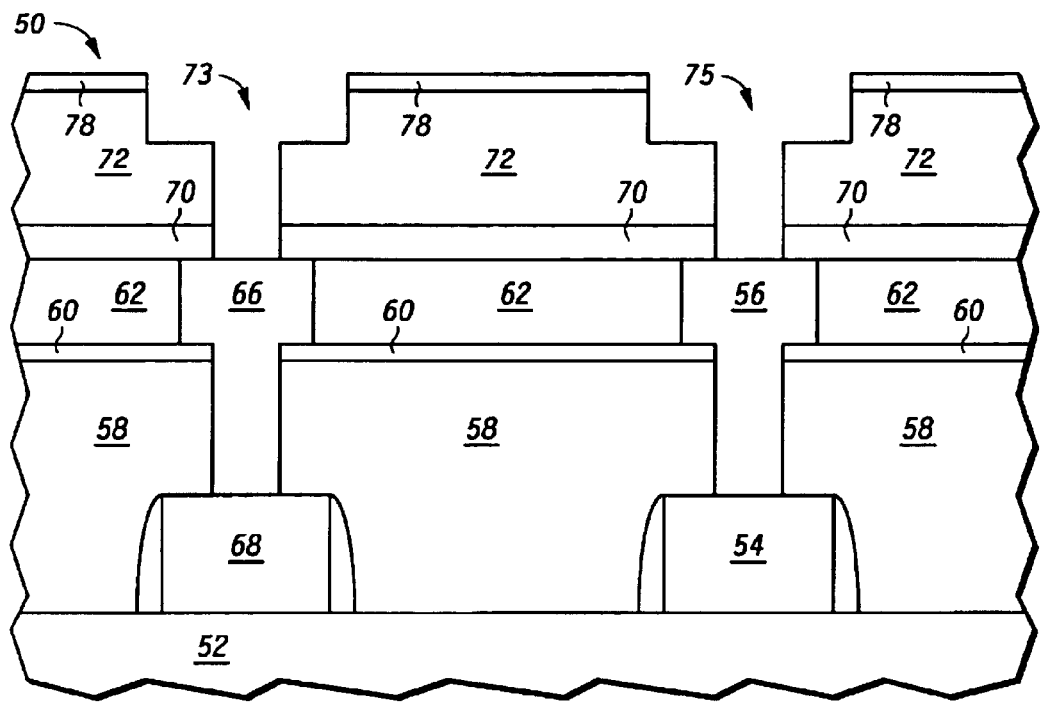

Illustrated in FIG. 13 is a cross-section of semiconductor device 50 wherein a trench etch or metal etch is performed according to the predetermined pattern. This etch removes exposed portions of the etch stop layer 70 and exposed portions of etch stop layer 78. Etch stop layer 78 has edges that define where opening 73 and opening 75 will be pushed down. Etch stop layer 70 therefore provides a self-alignment feature for the openings such as opening 73 and opening 75. When the etch is completed, the patterned photoresist layer 74 is removed. The shape and size of opening 73 and opening 75 is again modified by the presence of patterned photoresist layer 74.

Figure 14:
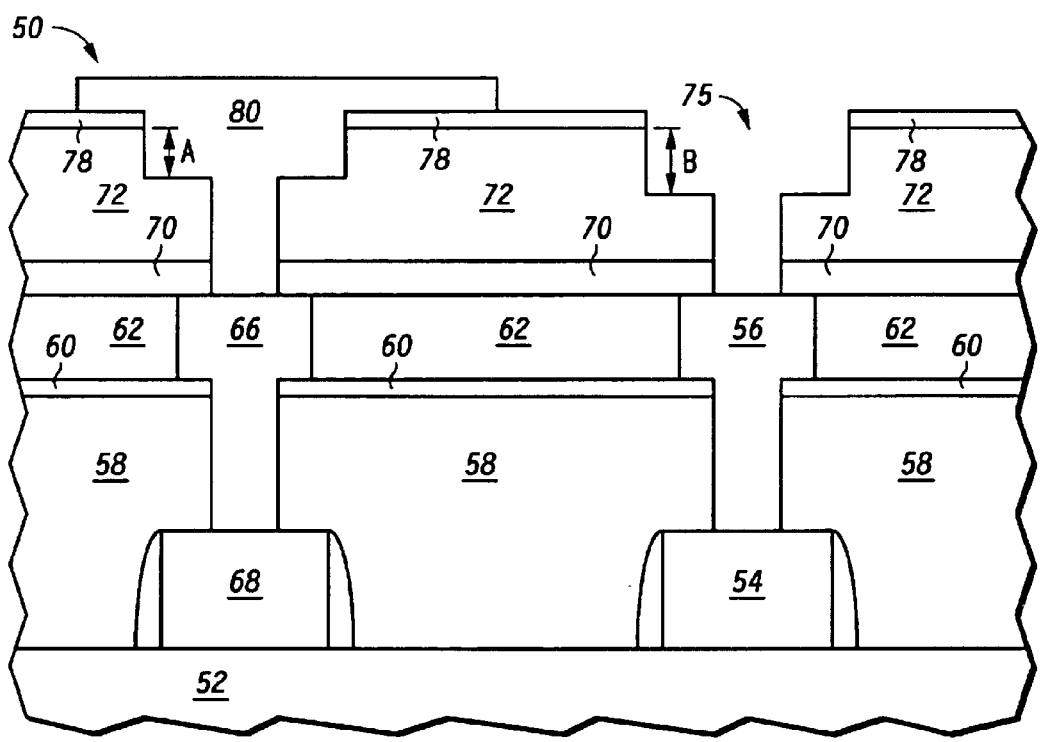

Illustrated in FIG. 14 is a cross-section of semiconductor device 50 having a photoresist 80 selectively formed overlying the trench overlying contact 66 within opening 73. The photoresist 80 extends laterally from the trench on the sides by a predetermined amount. The photoresist 80 functions as a second mask and is used to protect the metal trench from further etching. Additionally, opening 75 overlying contact 56 is further etched where portions of third dielectric layer 72 within the trench overlying contact 56 are removed. The result is that the depth of the opening within third dielectric layer 72 overlying contact 56 is now a depth of "B" while the depth of the opening within third dielectric layer 72 overlying contact 66 is a depth of "A". The values "A" and "B" may be accurately fabricated wherein B is some desired amount greater than A. It should be noted that in connection with the etch to form dimension "B", those portions of etch stop 78 not covered by photoresist 80 are used to fine protect those portions of third dielectric layer 72.

Figure 15:
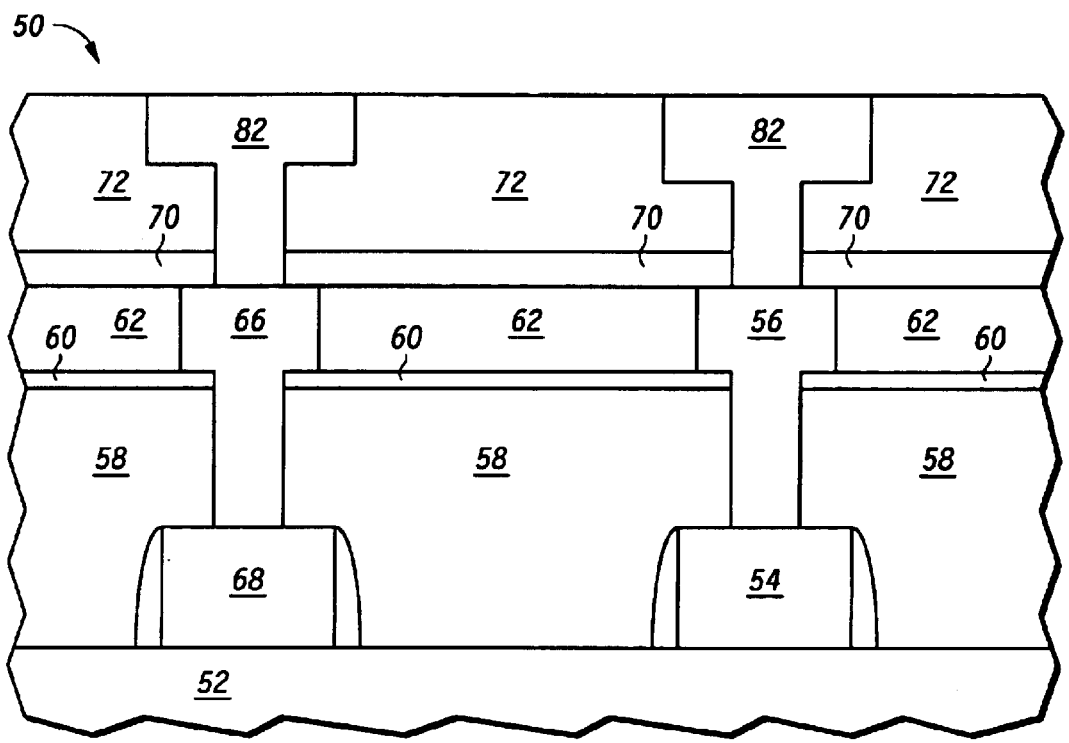

Illustrated in FIG. 15 is a cross-section of semiconductor device 50. The photoresist 80 is removed and etch stop 78 is removed from semiconductor device 50. In one form, the etch is a timed etch. A conductor 82 is deposited within each trench overlying conductors 66 and 56. To complete a resulting interconnect structure that has varying depth or thickness, conductor 82 that is deposited above the plane of the upper surface of etch stop 78 may be removed by one of several removal methods. In particular, but not by limitation, removal by electro chemical polishing, chemical mechanical polishing (CMP) or etching may be implemented. In order to obtain interconnects with differing thickness, the trench depths are modified in the implementation of FIGS. 10–15. In contrast, interconnects with differing thickness are obtained in FIGS. 1–8 by modifying a depth of an interlevel dielectric.

Figure 16:
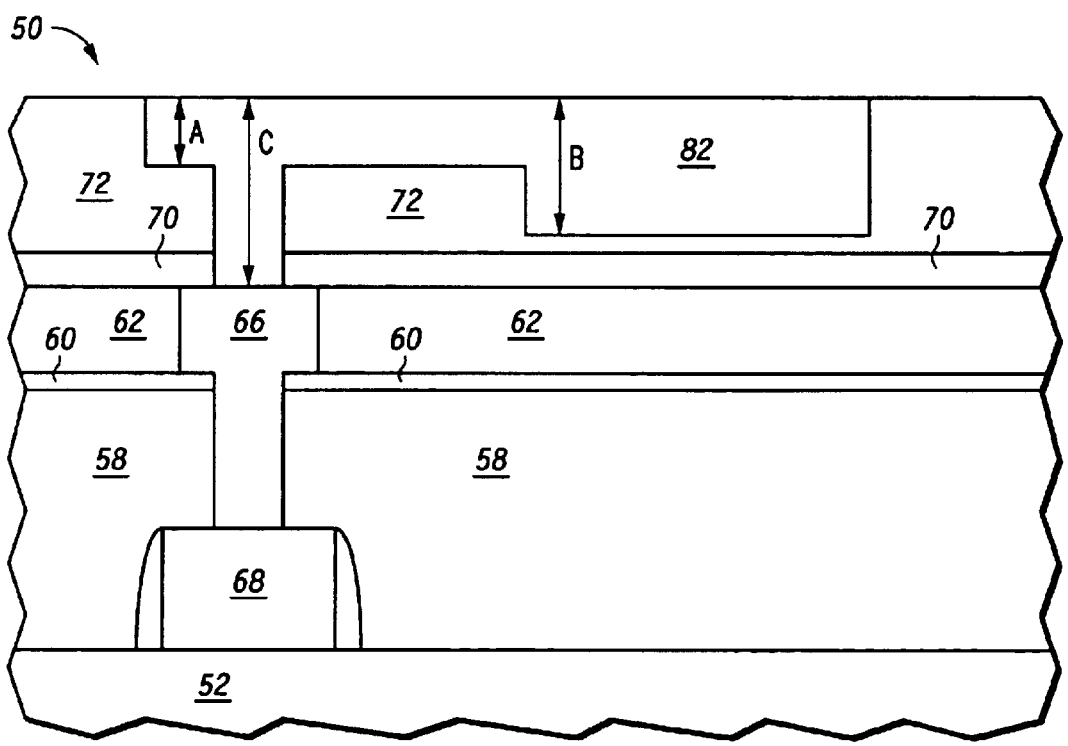
FIG. 16 illustrates in cross-sectional form another interconnect pattern formed with the method of FIGS. 10–15 and having areas of differing thickness.

Illustrated in FIG. 16 is a cross section of another embodiment of device structure 50. In particular, a cross section of an alternative interconnect structure for the conductive layer overlying conductor 66 in semiconductor device 50 is provided. The illustrated cross-section of FIG. 16 is a cross section in a plane that is orthogonal to the plane of the cross-section of FIGS. 10–15. For convenience of illustration, the same numbers are used for identical elements. In particular, conductor 82 fills a continuous opening in dielectric layer 72. Conductor 82 laterally extends to form a multiple height conductive layer. The multiple height is achieved by varying the patterning described in connection with FIGS. 11–15. As illustrated in FIG. 16, the continuous opening that conductor 82 fills has first, second and third portions of differing depth. The third portion of the continuous opening is immediately above conductor 66. The first portion of the continuous opening is immediately adjacent the third portion, and the second portion is laterally adjacent one side of the first portion. The first portion is shallower than the second portion and the second portion is shallower than the third portion. The first portion has an illustrated depth of A, the second portion has an illustrated depth of B and the third portion has an illustrated depth of C. The third portion of conductive layer 82 immediately above conductor 66 forms a via structure. The upper surface of conductor 82 is planar and the interconnect structure has only one surface that is planar. As a result, an interconnect structure results wherein a single interconnect in the same layer (i.e. intralayer) transitions between a "thin" region and a "thicker" region. It should be understood that from a manufacturing standpoint, the structure of conductor 82 may be formed by patterning the third portion of depth C followed by patterning the first portion of depth A and the second portion of depth B, or by first patterning the second portion of depth B followed by the third portion of depth C and the first portion of depth A, or by any other order of formation.

Figure 17:
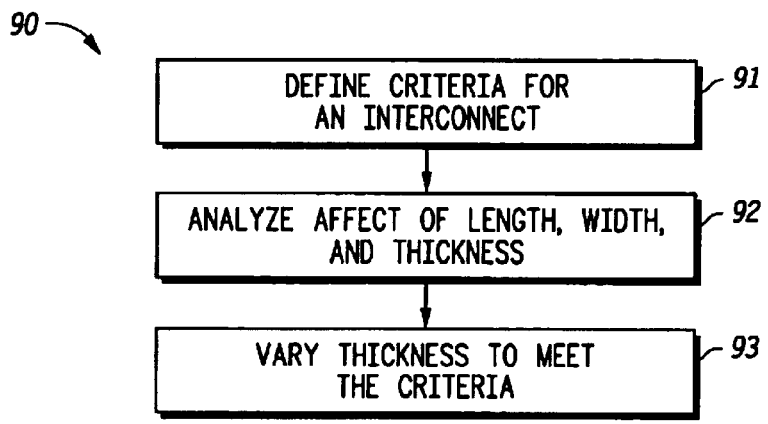
FIG. 17 illustrates in flow chart form a computer automated design (CAD) tool method for providing an interconnect with multiple thickness.

Illustrated in FIG. 17 is a method 90 for providing an interconnect for a semiconductor. In one form, method 90 may be implemented in software as a design automation tool for the purpose of implementing a circuit physical layout. The tool functions by using certain criteria to calculate what thickness at predetermined points along a conductor or interconnect that the conductor or interconnect should have in an integrated circuit. In a step 91 a user defines criteria for the interconnect. Various criteria and combinations or rankings of criteria may be used. For example, conventional circuit designs use two inverters as drivers at predetermined points along an expanse of an interconnect. The area or size of the inverters may be included in the criteria as well as the width of the conductor size. Related to such criteria is the speed of conduction and signal edge transition for the particular application of the interconnect. For some designs, the material chosen as the interconnect is used as a criteria parameter. Additionally, the size and nature (resistive, reactive, etc.) of a load that is connected to the interconnect is a relevant criteria. Design rules, noise levels and maximum conductor delay are other parameters that may be relevant criteria for step 91. In a step 92, an analysis is performed of the affect on resistance, capacitance and circuit performance that length, width and thickness of the interconnect has. For example, for a specific set of criteria, resistance and capacitance at predetermined points along the interconnect are calculated. As another example, a maximum interconnect length is determined in the analysis for a predetermined speed target. In a step 93, thickness of the interconnect is varied to meet the defined criteria for the interconnect that was provided in step 91. Predetermined interconnect thicknesses may be used in connection with reiterative calculations until a predetermined acceptable threshold value is obtained. Method 90 may be automated in a design tool to determine optimum thickness of only predetermined groups of conductors or interconnects in a circuit design or may be automated for every interconnect used in a design. Additional criteria, such as proximity to noisy or radiating conductors, may be factored into the analysis. In this manner, an efficient and automatic calculation of the thickness of an interconnect may be quickly made.

Figure 18:
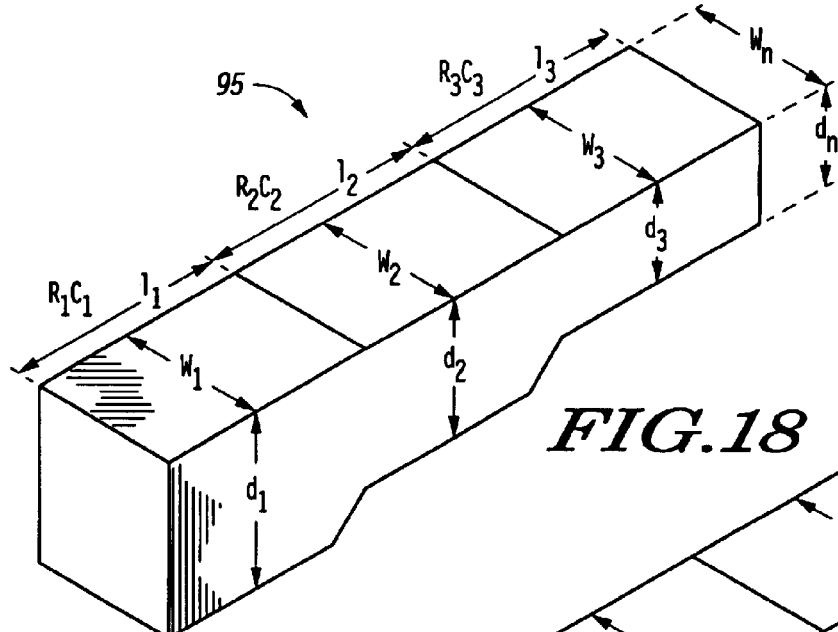
FIG. 18 illustrates in perspective form an interconnect with multiple thickness.

Illustrated in FIG. 18 is a perspective view of an interconnect 95 having various portions of differing thickness. Although there are a total of n sections, three sections respectively having dimensions W1, D1, L1; W2, D2, L2 and W3, D3, L3 are illustrated. As can be seen, the thickness of depth D3 is less than D2 that is less than D1. The widths W1, W2 and W3 may all be the same or may vary with respect to each other. Each section has associated with it a calculated RC characteristic that will vary based on the variation in the R and C values. The section with greater thickness will have less resistance and more capacitance. The section with thinner thickness will have more resistance and less capacitance.

Figure 19:
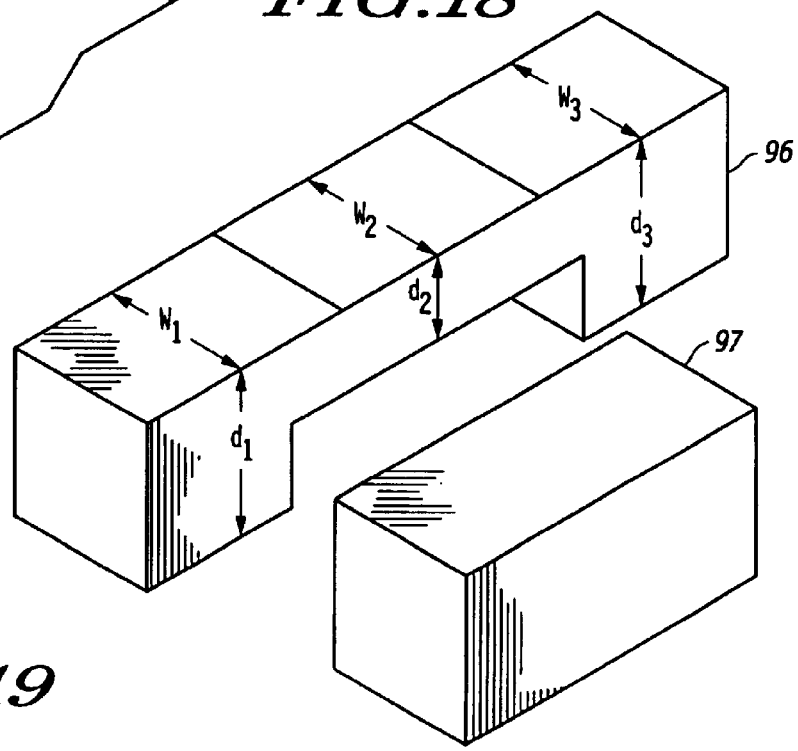
FIG. 19 illustrates in perspective form another interconnect with multiple thickness.

Illustrated in FIG. 19 is a perspective view of an interconnect 96 that is placed in close proximity to an interconnect 97. In the illustrated form, interconnect 96 also has three distinct sections as defined by the dimensions D1, W1; D2, W2 and D3, W3. Assume for purposes of illustration that the interconnect 97 is a known source of signal radiation and may detrimentally influence interconnect 96 based upon the close proximity of the two interconnects. Therefore, interconnect 96 is intentionally designed to have a predetermined section that has less thickness, D2, than other sections, such as D1 and D3. The reduced thickness results in less capacitive coupling in the section immediately adjacent the radiation source and significantly improves the performance of the interconnect 96. Since thickness D2 is less than D1 and D3, the interconnect 96 appears to be notched. It should be well understood that the transition from D2 to D1 and from D2 to D3 could also be sloped so that the notch is much less pronounced.

By now it should be appreciated that there has been provided a semiconductor multiple thickness interconnect structure and method having multiple thickness metal lines within a single metal level to reduce resistance and current density while keeping lines at minimum pitch (defined as a distance equal to a width of a minimum width conductor plus a required minimum spacing between two adjacent conductors), thereby providing area savings and improved electromigration performance. It should be appreciated that keeping lines at minimum pitch is not required (albeit an advantage) when implementing multiple thickness interconnect structures. The resistive/capacitive characteristics along an interconnect may be designed for optimal circuit performance while maintaining the same pitch. It should be understood that interconnect width may also be varied with the interconnect depth, but does not have to be varied to obtain the desired resistive/capacitive characteristics. The use of dual intralevel metal thickness enables resistance and capacitance to be optimized independently at the same metal level, thereby further optimizing interconnect performance. The thickness of the conductor interconnect may be selectively tuned for optimum performance based upon a specific application. Noise avoidance routing may be customized by varying the thickness of the interconnect. Electromigration issues may be addressed at the lower metal levels by increasing the thickness of a conductor rather than only adjusting the width of the conductor. By using thickness control of conductors to adjust for optimum resistance/capacitance characteristics, no impact on the number of wiring tracks at a given pitch is made.

Although the method and structure taught herein has been disclosed with respect to certain specific steps and materials, it should be readily apparent that various alternatives may be used. Any of the numerous forms of the interconnect structure illustrated herein may be used with a single metal layer filled at one time (single in-laid) or with two distinct metal layers filled at two different points in time (dual in-laid). For example, any type of semiconductor process may use the multiple thickness method and structure provided herein. Electrical contact to any type of semiconductor feature may be made using the dual thickness structure. While embodiments illustrating primarily two thicknesses are provided, it should be appreciated that any number of thickness may be implemented. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a multiple thickness interconnect, comprising:

providing a semiconductor structure having a substrate;

forming a first dielectric layer over the substrate;

forming a continuous opening in the first dielectric layer having a plurality of differing depths correlated to desired predetermined values of resistance and capacitance at predetermined points of the continuous opening, wherein the continuous opening has a first portion having a substantially planar horizontal lower surface, a second portion having a substantially planar horizontal lower surface, and a third portion having a substantially planar horizontal lower surface, wherein the first portion is shallower than the second portion and the second portion is shallower than the third portion;

forming a conductive layer in the continuous opening; and removing the conductive layer above the first dielectric layer to leave a first current carrying layer in the first portion, a second current carrying layer in the second portion and adjoining the first current carrying layer, and a via in the third portion, the first current carrying layer, the second current carrying layer and the via being electrically connected as a result of being physically continuous.

2. The method of claim 1, wherein the first dielectric layer has a top portion having a different etch characteristic than a lower portion immediately below the top portion, and wherein forming the continuous opening comprises:

etching the top portion over an intended location of the continuous opening with a first etchant; and etching the lower portion in the intended location of the continuous opening with a second etchant that is different from the first etchant.

3. The method of claim 1, further comprising:

forming the first current carrying layer, the second current carrying layer and the third current carrying layer with a width that differs with respect to each other.

4. The method of claim 1, further comprising:

separating the first portion and the third portion by the second portion.

5. The method of claim 1 further comprising patterning the first dielectric layer to form a sloped edge between the first area and the second area.

6. The method of claim 5 further comprising forming the sloped edge to have an angle that is not greater than about 50 degrees.

7. The method of claim 1, wherein the step of removing comprises electro-chemical polishing.

8. The method of claim 7, wherein the step of removing further comprises, after electro-chemical polishing, performing one of a dry etch and a wet etch.

9. A method for forming a multiple thickness interconnect, comprising:

providing a semiconductor structure having a substrate;

forming a control electrode with sidewall spacers on the substrate;

forming a first dielectric layer over the substrate and over and around the control electrode with sidewall spacers;

removing a portion of the first dielectric layer overlying the control electrode with sidewall spacers to expose the control electrode with sidewall spacers;

filling the portion of the first dielectric layer with a conductive material;

forming a second dielectric layer overlying the first dielectric layer;

patterning the second dielectric layer to form a patterned second dielectric layer having an opening above the control electrode with sidewall spacers;

filling the opening of the second dielectric layer with the conductive material;

forming a third dielectric layer overlying the patterned second dielectric layer;

patterning and etching the third dielectric layer selective to the second dielectric layer to form a continuous opening in the third dielectric layer having a plurality of differing depths correlated to desired predetermined values of resistance and capacitance at predetermined points of the continuous opening, wherein the continuous opening has a first portion having a substantially planar horizontal lower surface, a second portion having a substantially planar horizontal lower surface, and a third portion having a substantially planar horizontal lower surface, the first portion being shallower than the second portion and the second portion being shallower than the third portion; and forming a conductive layer in the continuous opening to leave a first current carrying layer in the first portion, a second current carrying layer in the second portion and adjoining the first current carrying layer, and a via in the third portion, the first current carrying layer, the second current carrying layer and the via being electrically connected as a result of being physically continuous.

10. A method for forming multiple thickness interconnects, comprising:

providing a semiconductor structure having a substrate and a first dielectric layer over the substrate separating a first gate electrode from a second gate electrode;

forming a second dielectric layer over the first dielectric layer;

patterning the second dielectric layer to have a first area and a second area, wherein the first area is thinner than the second area, the second dielectric layer having an upper surface in the first area that is not planar with an upper surface in the second area;

forming a planarized layer over the second dielectric layer;

patterning the planarized layer to have a first opening over a first portion of the first area and a second opening over a first portion of the second area;

etching the second dielectric layer to extend the first opening through the second dielectric layer to an upper surface of the first dielectric layer, the first opening overlying a portion of the first gate electrode, and etching the second dielectric layer to extend the second opening through the second dielectric layer to the upper surface of the first dielectric layer, the second opening overlying a portion of the second rate electrode, wherein a depth of the second dielectric in the first opening is less than a depth of the second dielectric in the second opening to create multiple thickness interconnects in a same dielectric layer;

forming a conductive layer in the first opening and the second opening and over the second dielectric layer to make electrical contact to the first gate electrode and the second fate electrode; and electro-chemical polishing the conductive layer above the second dielectric layer.

11. The method of claim 10 further comprising:

completely removing the planarized layer after said etching.

12. The method of claim 10, further comprising:

forming a third dielectric layer over the first dielectric layer prior to forming the second dielectric layer;

wherein etching the second dielectric layer further comprises:

etching the second dielectric layer in the first opening and the second opening with a first etchant that etches the second dielectric layer faster than the third dielectric layer, and etching the third dielectric layer in a region aligned with the first opening and the second opening with a second etchant different from the first etchant.

13. The method of claim 10, wherein the first opening and the second opening are electrically continuous.

14. The method of claim 10, wherein the first opening and the second opening are electrically isolated.

15. A method of forming a semiconductor device structure over a semiconductor substrate, comprising:

forming a non-planar dielectric over the semiconductor substrate, the non-planar dielectric layer having an upper surface in a first area that is not planar with an upper surface in a second area;

depositing a removable layer over the non-planar dielectric layer of sufficient thickness to achieve a substantially planar surface on the removable layer and having at least a thickness of a first dimension;

patterning the removable layer by identifying a first opening overlying the first area of the non-planar dielectric layer;

removing portions of the removable layer and the non-planar dielectric layer underlying the first opening and the second opening; and filling conductive material in those portions of the non-planar dielectric layer to form interconnects having differing depths.

16. The method of claim 15 further comprising:

removing a portion or the removable layer not exceeding the first dimension to provide a reduced-thickness removable layer with a substantially planar surface prior to patterning the removable layer.

* * * * *

UNITED STATES PATENT AND TRADEMARK OFFICE
CERTIFICATE OF CORRECTION

PATENT NO. : 6,815,820 B2 Page 1 of 1
DATED : November 9, 2004
INVENTOR(S) : Kathleen C. Yu et al.

It is certified that error appears in the above-identified patent and that said Letters Patent is hereby corrected as shown below:

<u>Column 11,</u>
Line 5, add -- layer -- between "dielectric" and "over".
Line 15, add -- and a second opening overlying the second area of the non-planar dielectric layer -- between "layer" and ";".

Signed and Sealed this

Twenty-fifth Day of April, 2006

JON W. DUDAS
*Director of the United States Patent and Trademark Office*